(12) United States Patent
Kong (10) Patent No.: US 9,691,644 B2
(45) Date of Patent: Jun. 27, 2017

(54) SUPPORTING UNIT, SUBSTRATE TREATING DEVICE INCLUDING THE SAME, AND METHOD OF MANUFACTURING THE SUPPORTING UNIT

(71) Applicant: SEMES CO., LTD., Chungcheongnam-do (KR)

(72) Inventor: Tae Kyung Kong, Chungcheongnam-do (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 628 days.

(21) Appl. No.: 14/039,422

(22) Filed: Sep. 27, 2013

(65) Prior Publication Data

US 2014/0091077 A1    Apr. 3, 2014

(30) Foreign Application Priority Data

Sep. 28, 2012  (KR) .................. 10-2012-0109002
Dec. 6, 2012   (KR) .................. 10-2012-0141025

(51) Int. Cl.
| | |
|---|---|
| *H05B 3/68* | (2006.01) |
| *H01L 21/67* | (2006.01) |
| *C25D 5/02* | (2006.01) |
| *C23C 18/18* | (2006.01) |
| *C23C 18/16* | (2006.01) |

(52) U.S. Cl.
CPC .... *H01L 21/67103* (2013.01); *C23C 18/1603* (2013.01); *C23C 18/1608* (2013.01); *C23C 18/1651* (2013.01); *C23C 18/1653* (2013.01); *C23C 18/1689* (2013.01); *C23C 18/1879* (2013.01); *C25D 5/02* (2013.01); *C25D 5/022* (2013.01)

(58) Field of Classification Search
CPC ..................... H05B 3/68; H05B 3/50
USPC .......... 219/443.1, 444.1, 461.1, 465.1, 466.1
See application file for complete search history.

(56) References Cited

U.S. PATENT DOCUMENTS

| | | | | |
|---|---|---|---|---|
| 6,507,006 | B1 * | 1/2003 | Hiramatsu | ........ H01L 21/67103 219/444.1 |
| 6,849,938 | B2 * | 2/2005 | Ito | ..................... H01L 21/67103 219/520 |

(Continued)

FOREIGN PATENT DOCUMENTS

| | | | |
|---|---|---|---|
| JP | 2001-354473 A | | 12/2001 |
| JP | 2009158906 A | * | 7/2009 |

(Continued)

*Primary Examiner* — Dana Ross
*Assistant Examiner* — Ayub Maye
(74) *Attorney, Agent, or Firm* — Carter, DeLuca, Farrell & Schmidt, LLP (57) ABSTRACT

Provided is a supporting unit. The supporting unit includes: a supporting plate including a substrate on a top surface thereof; and a heater having a predetermined pattern at a bottom surface of the supporting plate and heating the supporting plate, wherein the heater includes: a first metal plating layer applied on the bottom surface of the supporting plate along the predetermined pattern; an anti-oxidation layer of a conductive material applied on the first metal plating layer along the predetermined pattern; and a second metal plating layer of a conductive material applied on the anti-oxidation layer in a portion of the pattern.

10 Claims, 12 Drawing Sheets

(56) References Cited

U.S. PATENT DOCUMENTS

| | | | |
|---|---|---|---|
| 7,071,551 B2* | 7/2006 | Hiramatsu | H01L 21/67103 257/690 |
| 7,417,206 B2* | 8/2008 | Nakamura | H01L 21/67103 219/444.1 |
| 8,680,441 B2* | 3/2014 | Singh | H01L 21/67109 118/725 |
| 2004/0097359 A1* | 5/2004 | Hiramatsu | B32B 18/00 501/98.4 |
| 2006/0000822 A1* | 1/2006 | Nakamura | H01L 21/67103 219/409 |
| 2006/0197218 A1* | 9/2006 | Liu | H01L 23/3128 257/706 |
| 2010/0154874 A1* | 6/2010 | Hirose | H01L 21/76254 136/255 |

FOREIGN PATENT DOCUMENTS

| | | |
|---|---|---|
| KR | 1020060049383 A | 5/2006 |
| KR | 1020070046720 A | 5/2007 |
| KR | 1020090069938 A | 7/2009 |

\* cited by examiner

SUPPORTING UNIT, SUBSTRATE TREATING DEVICE INCLUDING THE SAME, AND METHOD OF MANUFACTURING THE SUPPORTING UNIT

CROSS-REFERENCE TO RELATED APPLICATIONS

This U.S. non-provisional patent application claims priority under 35 U.S.C. §119 of Korean Patent Application Nos. 10-2012-0109002, filed on Sep. 28, 2012, and 10-2012-0141025, filed on Dec. 6, 2012, the entire contents of which are hereby incorporated by reference.

BACKGROUND OF THE INVENTION

The present invention disclosed herein relates to a supporting unit, and more particularly, to a supporting unit including a heater.

Recently, as semiconductor devices are highly integrated, a unit area of one chip becomes smaller and accordingly, the critical dimension (CD) of a circuit line width is reduced. Therefore, a photolithography process for implementing a pattern, which is used for forming a circuit on a semiconductor substrate, becomes important. The photolithography process includes an application process for applying a photoresist on a substrate, an exposure process for irradiating light on the photoresist, and a development process for partially removing the photoresist according to an exposed pattern. Such an application process, exposure process, and a development process include a bake process for heating a semiconductor substrate.

Examples of the bake process include a soft bake process for alleviating a stress occurring when a photoresist is applied and a hard bake process for chemically stabilizing an exposed portion after an exposure process is performed.

As patterns formed on a substrate are miniaturized gradually, uniformly heating a substrate and maintaining a temperature during a bake process for heating the substrate at a predetermined temperature may service as important factors to control the CD.

SUMMARY OF THE INVENTION

The present invention provides a supporting unit capable of uniformly heating each area of substrate.

The present invention also provides a method of manufacturing a supporting unit capable of adjusting a resistance value of a heater pattern.

Embodiments of the present invention provide supporting units including: a supporting plate including a substrate on a top surface thereof; and a heater having a predetermined pattern at a bottom surface of the supporting plate and heating the supporting plate, wherein the heater includes: a first metal plating layer applied on the bottom surface of the supporting plate along the predetermined pattern; an anti-oxidation layer applied on the first metal plating layer along the predetermined pattern; and a second metal plating layer of a conductive material applied on the anti-oxidation layer in a portion of the pattern.

In some embodiments, the second metal plating layer may have a thinker thickness than the anti-oxidation layer.

In other embodiments, the anti-oxidation layer and the second metal plating layer may be formed of the same material.

In still other embodiments, the second metal plating layer may be formed of gold (Au).

In even other embodiments, the predetermined pattern may include a terminal part that is directly connected to a wire connected to an external power, and the first metal plating layer, the anti-oxidation layer, and the second metal plating layer may be sequentially applied in the terminal part.

In yet other embodiments, the heater may include: a first pattern formed in a first area of the supporting plate; a second pattern formed in a second area of the supporting plate separated from the first area, and separated from the first pattern; and a connection pattern connecting the first pattern and the second pattern, wherein the first metal plating layer and the anti-oxidation layer may be sequentially applied on the bottom surface of the supporting plate in the first pattern and the second pattern; and the first metal plating layer, the anti-oxidation layer, and the second metal plating layer may be sequentially applied on the bottom surface of the supporting plate in the connection pattern.

In other embodiments of the present invention, substrate processing devices include: a chamber having a space therein; a supporting plate provided inside the chamber and including a substrate on a top surface thereof; and a heater forming a predetermined pattern at a bottom surface of the supporting plate and heating the supporting plate, wherein the heater has a heating area for generating heat and a non-heating area for generating no heat.

In some embodiments, a first metal plating layer and an anti-oxidation layer may be sequentially applied on the bottom surface of the supporting plate in the heating area; and the first metal plating layer, the anti-oxidation layer, and a second metal plating layer may be sequentially applied on the bottom surface of the supporting plate in the non-heating area, wherein the second metal plating layer may have a thicker thickness than the anti-oxidation layer of a metal material.

In other embodiments, the anti-oxidation layer and the second metal plating layer are formed of the same material.

In still other embodiments, the heater may include a terminal part that is directly connected to a wire applying current, and the terminal part may correspond to the non-heating area.

In even other embodiments, the bottom surface of the supporting plate may have a first area and a second area separated from each other, wherein the heater may include: a first pattern formed in the first area and corresponding to the heating area; a second pattern formed in the second area and corresponding to the heating area; and a connection pattern connecting the first pattern and the second pattern and corresponding to the non-heating area.

In still other embodiments of the present invention, methods of forming a heater having a heating area and a non-heating area as a predetermined pattern at a bottom surface of a supporting plate may include: forming a first metal plating layer pattern by forming a first metal plating layer in the pattern form on the bottom surface of the supporting plate; forming an anti-oxidation layer in the pattern form on the first metal plating layer; and forming a second metal plating layer having a thicker thickness than the anti-oxidation layer in the anti-oxidation layer area corresponding to the non-heating area.

In even other embodiments of the present invention, methods of forming a heater having a heating area and a non-heating area as a predetermined pattern at a bottom surface of a supporting plate may include: forming a first metal plating layer pattern by forming a first metal plating layer in the pattern form on the bottom surface of the supporting plate; forming a second metal plating layer in a first metal plating layer area corresponding to the non-heating area; and forming an anti-oxidation layer on the first metal plating layer in the heating area and forming an anti-oxidation layer on the second metal plating layer in the non-heating area.

In some embodiments, the anti-oxidation layer may be formed through an electroless plating method; and the second metal plating layer may be formed through an electrolytic plating method.

In other embodiments, the forming of the first metal plating layer pattern may include: applying a catalyst of a metal material on the bottom surface of the supporting plate; forming the first metal plating layer on the bottom surface of the supporting plate where the catalyst is applied through an electroless plating method; and etching remaining areas except the pattern form in the first metal plating layer.

In still other embodiments, the forming of the second metal plating layer may include applying a mask in the anti-oxidation layer area corresponding to the heating area before the forming of the second metal plating layer.

In even other embodiments, the forming of the second metal plating layer may include applying a mask in the first metal plating layer corresponding to the heating area before the forming of the second metal plating layer.

In yet other embodiments, the anti-oxidation layer and the second metal plating layer may be formed of the same material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 1:
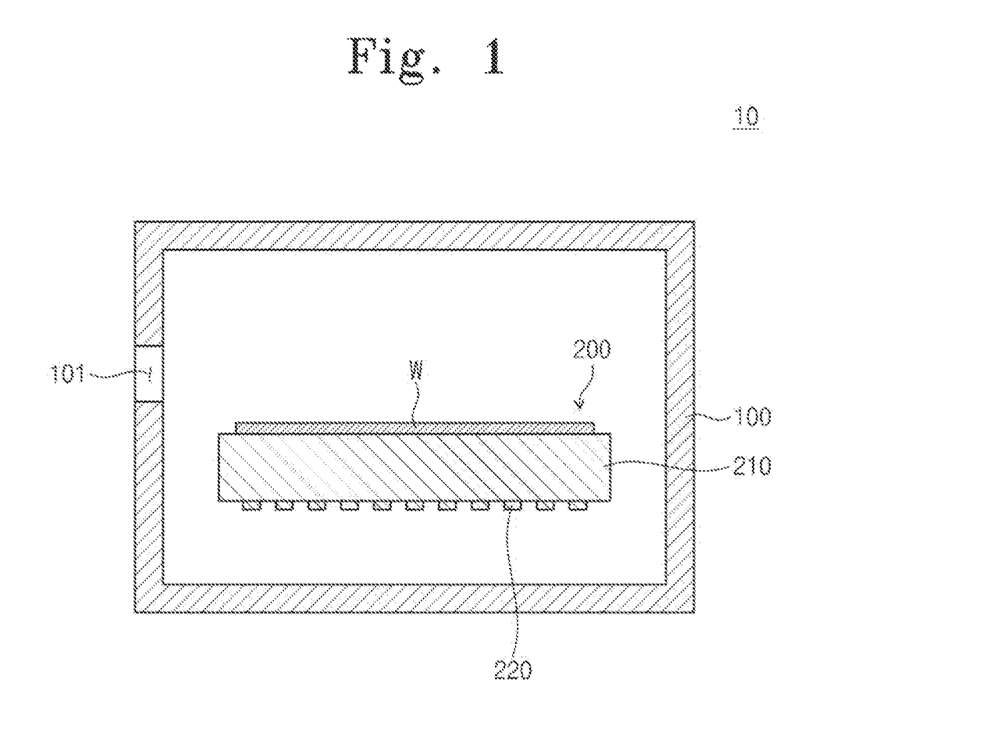
FIG. 1 is a view illustrating a substrate processing device according to an embodiment of the present invention.
Figure 2:
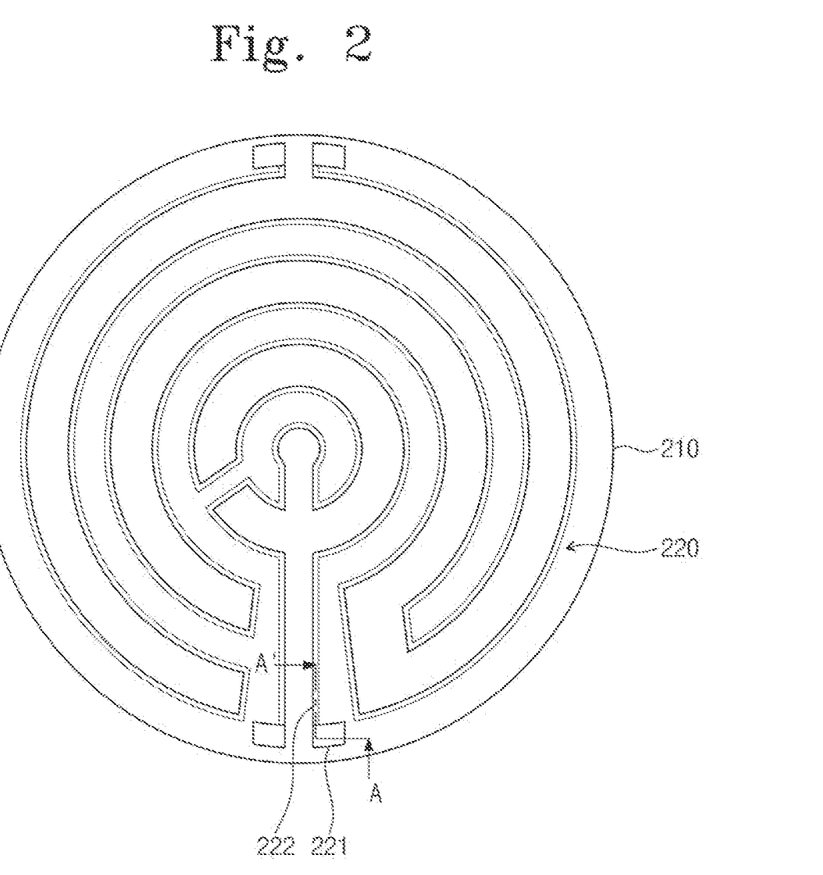
FIG. 2 is a bottom view illustrating a supporting unit of FIG. 1.

FIG. 1 is a view illustrating a substrate processing device according to an embodiment of the present invention. FIG. 2 is a bottom view illustrating a supporting unit of FIG. 1.

Referring to FIGS. 1 and 2, the substrate processing device 10 includes a chamber 100 and a supporting unit 200.

A space is formed inside the chamber 100. An opening 101 is formed at one sidewall of the chamber 100 and provided as a path through which a substrate W enters and exits.

The supporting unit 200 is provided inside the chamber to support the substrate W. The supporting unit 200 includes a supporting plate 210 and a heater 220.

The supporting plate 210 is a disk having a predetermined thickness and has a radius corresponding to or greater than the substrate W. The substrate W is disposed on the top surface of the supporting plate 210. The supporting plate 210 may be formed of ceramic material. The ceramic material at a high temperature has high chemical stability and less heat deformation.

The heater 220 is formed in a predetermined pattern at the bottom surface of the supporting plate 210 and generates heat by resisting an applied current. The heater 220 generates heat in proportional to a resistance value. A heat generated from the heater 220 is delivered to the substrate W through the supporting plate 210. The heat is dissipated while passing through the supporting plate 210 and delivered to the substrate W with uniform temperature distribution.

The pattern of the heater 220 has a heating area 221 and a non-heating area 222. The heating area 221 has a large resistance value, and thus has a large heating value. The non-heating area 222 has a small resistance value, and thus has a small heating value. The resistance value of the non-heating area 222 is close to 0Ω and in this case, a heating value is minimized or no heating occurs.

The pattern of the heater 220 has a terminal part 221. The terminal part 221 is an area that is directly connected to a wire connected to an external power. The terminal part 221 is an area applying current to the pattern of the heater 220 and applies current to a portion instead of uniformly applying current to each area. When heat is generated at the terminal part 221, temperature distribution delivered to the substrate W becomes non-uniform. Since a point where the terminal part 221 is provided has a relatively high heating value, an area of the substrate W adjacent to the terminal part 221 may be heated locally at a higher temperature than other areas. Such a temperature imbalance of the substrate W makes substrate processing uneven. Due to the above reason, the terminal part 221 is provided as a non-heating area.

Figure 3:
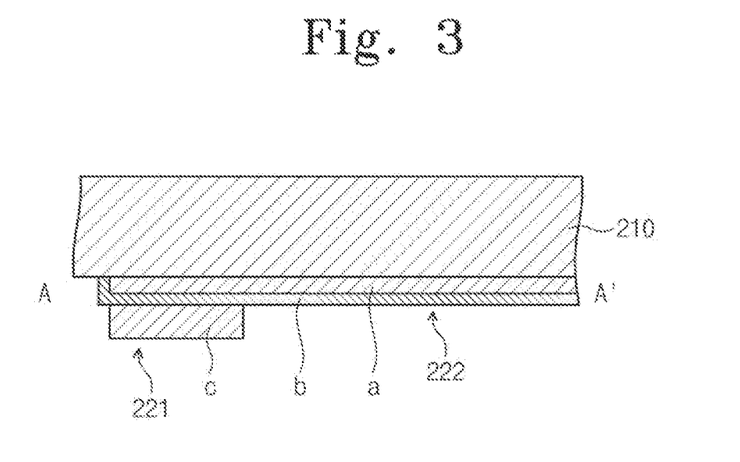
FIG. 3 is a sectional view taken along line A-A' of FIG. 2.

FIG. 3 is a sectional view taken along line A-A' of FIG. 2.

Referring to FIG. 3, the heater 220 includes a first metal plating layer a, an anti-oxidation layer b, and a second metal plating layer c.

The first metal plating layer a is formed along the pattern of the heater 220 at a predetermined thickness on the bottom surface of the supporting plate 210. The first metal plating layer a is formed of a conductive metal material having a predetermined resistance value. According to an embodiment of the present invention, the first metal plating layer a may be formed of nickel or a nickel-mixed metal material. Or, the first metal plating layer a may be formed of a NiP material. The first metal plating layer a has the same resistance value in each area of the pattern of the heater 220.

The anti-oxidation layer b is thinly formed on the first metal plating layer a along the pattern of the heater 220. The anti-oxidation layer b blocks the first metal plating layer a from being exposed to air to prevent the oxidation of the first metal plating layer a. The anti-oxidation layer b is formed of a metal material having a less resistance value than the first metal plating layer a. The anti-oxidation layer b may be formed of an Au material. The anti-oxidation layer b may have a very thinner thickness than the first metal plating layer a, and has a less resistance value than the first metal plating layer a. Therefore, the anti-oxidation layer b may less affect the amount of an entire heating value of the heater 220.

The second metal plating layer c is formed on the anti-oxidation layer b in the non-heating area 222. According to an embodiment of the present invention, the second metal plating layer c is formed on the anti-oxidation layer b at the terminal part 221. The second metal plating layer c is formed at a thicker thickness than the first metal plating layer a and the anti-oxidation layer b. The second metal plating layer c is formed of a metal material having a less resistance value than the first metal plating layer a. The second metal plating layer c may be formed of the same material as the anti-oxidation layer b. The second metal plating layer c may be formed of an Au material. Since the second metal plating layer c is thick, a partial resistance of the pattern of the heater 220 having the second metal plating layer c is close to 0Ω. Thus, an area having the second metal plating layer c is provided as the non-heating area 222 where no heat is generated.

According to the above-mentioned embodiment of the present invention, although it is described that the terminal part 221 corresponds to a non-heating area having the second metal plating layer c, the second metal plating layer c may be formed in the heating area 221 providing heat from the terminal part 221 to a desired pattern. In an area of the pattern of the heater 220, the second metal plating layer c may be formed in an area where heat is to be prevented.

Figure 4:
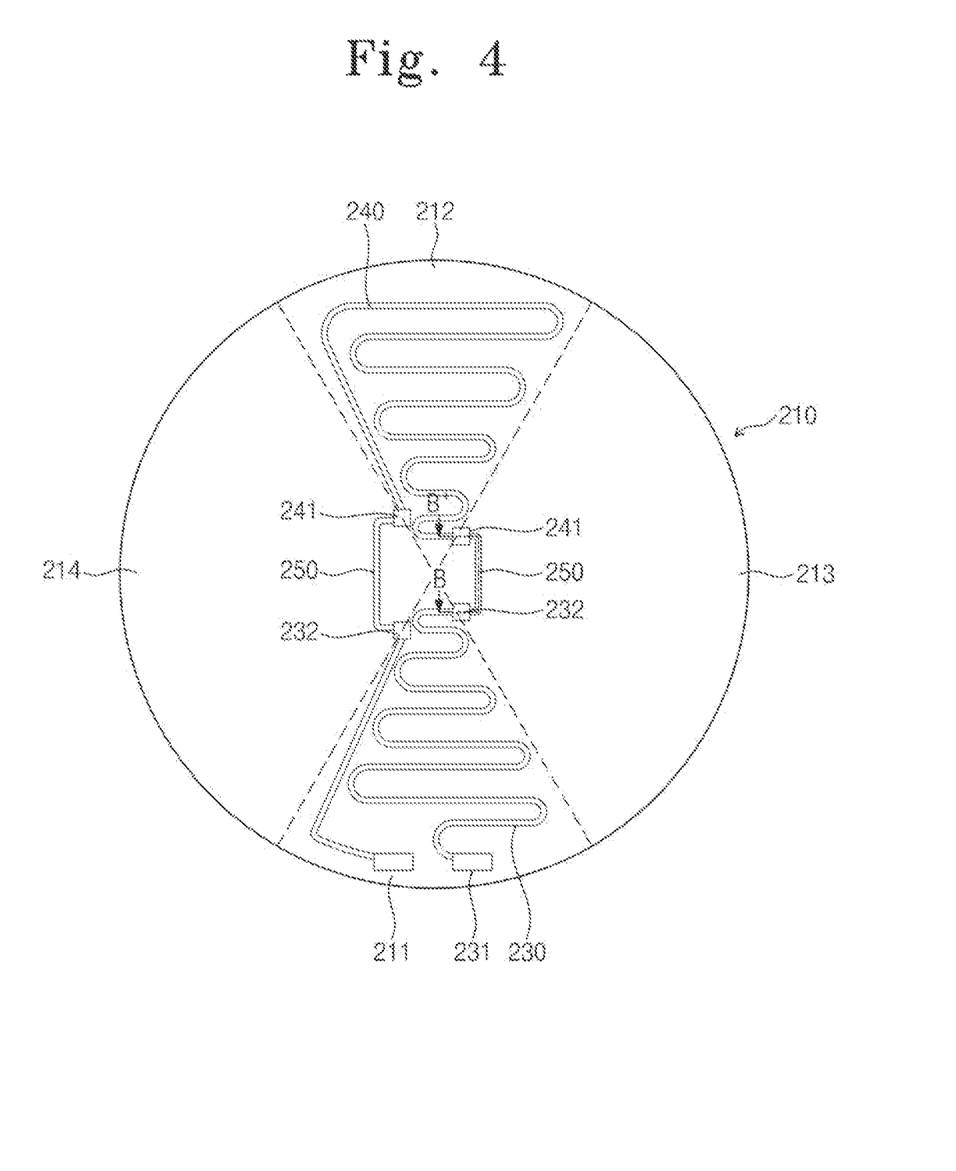
FIG. 4 is a view illustrating a supporting unit according to another embodiment of the present invention.

FIG. 4 is a view illustrating a supporting unit according to another embodiment of the present invention.

Referring to FIG. 4, the bottom surface of the supporting plate 210 may be divided into a plurality of areas according to an area having a heater pattern. According to an embodiment of the present invention, the bottom surface of the supporting plate 21 may be divided into four areas, and for convenience of description, the four areas are referred to as first to fourth areas 211 to 214. The first area 211 is positioned symmetric to the second area 212 on the basis of the center of the supporting plate 210, and the third area 213 is positioned symmetric to the fourth area 214. A heater pattern is provided in each area. For further understanding, a first pattern 230 in the first area 211 and a second pattern 240 in the second area 212 are shown in FIG. 4.

Figure 5:
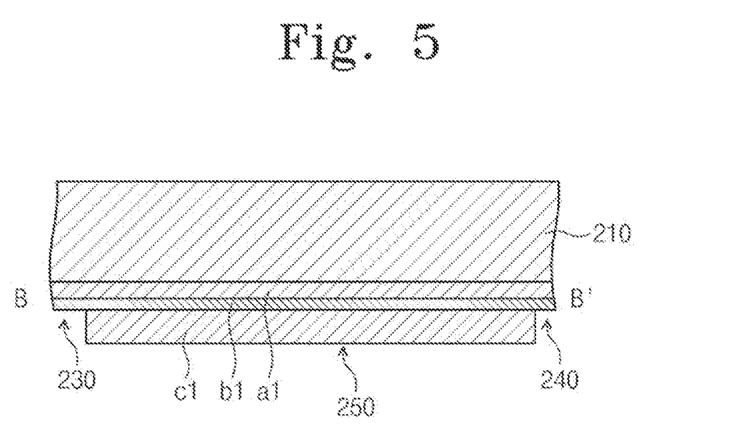
FIG. 5 is a sectional view taken along line B-B' of FIG. 4.

The first pattern 230 and the second pattern 240 form heater patterns separated from each other. The terminal part 231 to which external current is applied is provided to only the first pattern 230. In order to deliver a current applied to the first pattern 230 to the second pattern 240, a connection pattern 250 is provided. The connection pattern 250 connects a connection terminal 232 of the first pattern 230 to a connection terminal 241 of the second pattern 240. According to an embodiment of the present invention, the connection pattern 250 connects the first pattern 230 and the second pattern 240, passing through the third area 213 and the fourth area 214. Since the connection pattern 250 is provided only for applying current from the first pattern 230 to the second pattern 240, it is required not to affect a temperature distribution of the substrate W. Since the connection pattern 250 is locally provided to the supporting plate 210, when heat occurs from the connection pattern 250, only a portion of the substrate W are heated. Therefore, the connection pattern 250 is required to be provided to a non-heating area where no heat occurs. Thus, the connection pattern 250 may have a structure in which a first metal plating layer a1, an anti-oxidation layer b2, and a second metal plating layer c1 are sequentially applied on the bottom surface of the supporting plate 210 as shown in FIG. 5. The first metal plating layer a1, the anti-oxidation layer b2, and the second metal plating layer c1 are formed of the same materials as those in the embodiment of FIG. 3. Since the second metal plating layer c3 has a relatively thick thickness, the total resistance of the connection pattern 250 is close to 0Ω. Due to this, since almost no heat is generated in the connection pattern 250, the connection pattern 250 minimally affects a temperature distribution of the substrate W.

Figure 6:
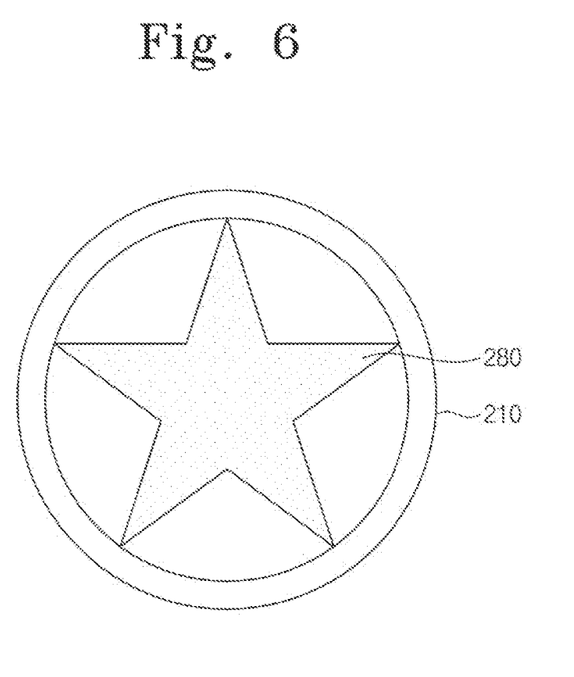
FIG. 6 is a view illustrating a supporting unit according to another embodiment of the present invention.

FIG. 6 is a view illustrating a supporting unit according to another embodiment of the present invention.

Referring to FIG. 6, a non-heating area 280 may be provided in various forms at the bottom surface of the supporting plate 210. According to an embodiment of the present invention, the non-heating area 280 may be provided in a star-like shape. As shown in FIG. 5, the first metal plating layer a1, the anti-oxidation layer b1, and the second metal plating layer c1 are sequentially applied at the bottom surface of the supporting plate 210 in the non-heating area 280. The second metal plating layer c1 is provided at a relatively thick thickness. The shape of the non-heating area 280 is not limited to the above, and may be determined according to the position and shape of each area of a substrate controlling temperature.

Figure 7:
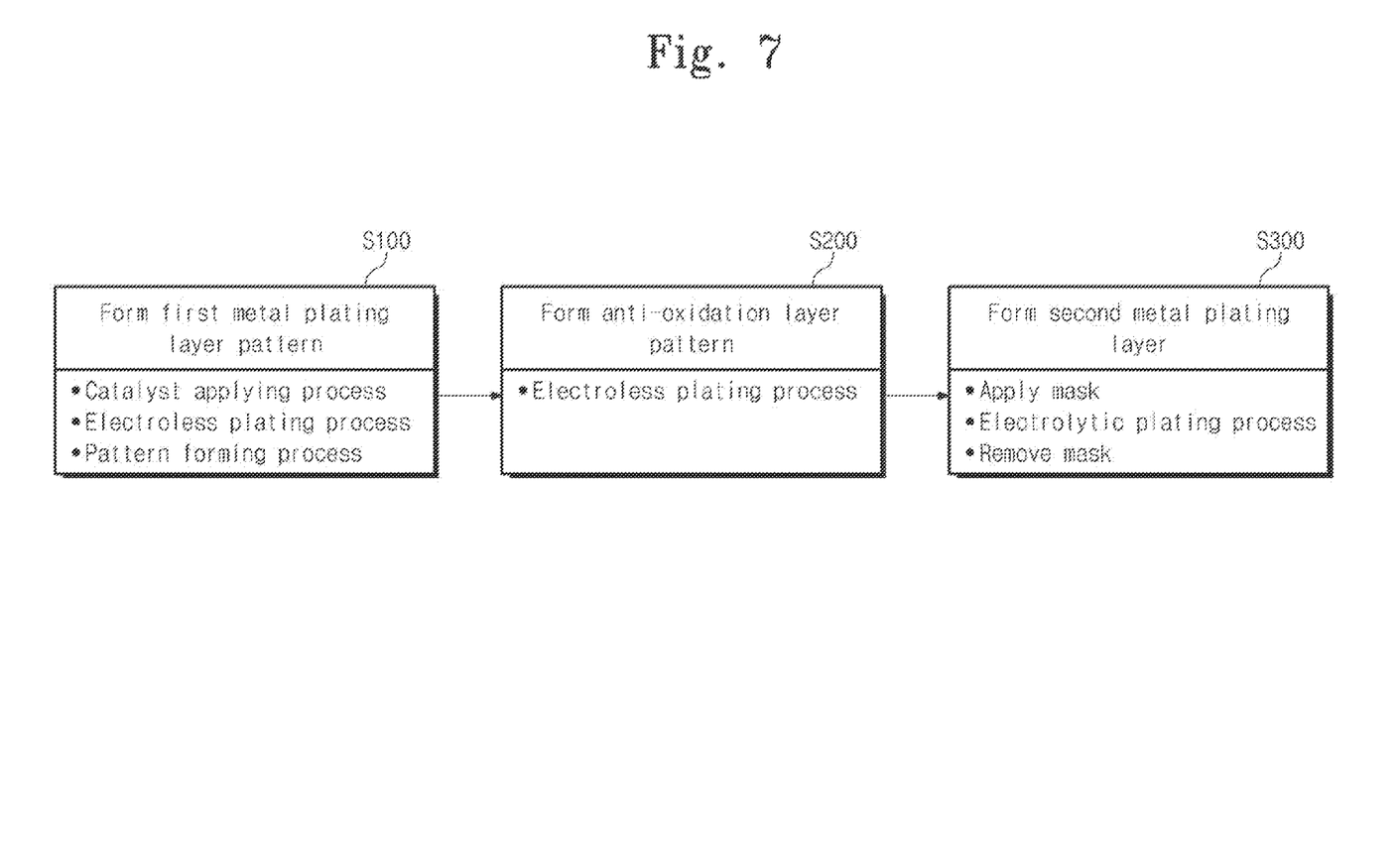
FIG. 7 is a flowchart illustrating a process of manufacturing a supporting unit according to an embodiment of the present invention.

FIG. 7 is a flowchart illustrating a process of manufacturing a supporting unit according to an embodiment of the present invention. FIGS. 8 to 12 are views illustrating a process of manufacturing a supporting unit according to the flowchart of FIG. 7.

Referring to FIGS. 7 to 12, the method of manufacturing a supporting unit includes forming a first metal plating layer pattern in operation S100, forming an anti-oxidation layer pattern in operation S200, and forming a second metal plating layer in operation S300.

The forming of the first metal plating layer pattern in operation S100 is forming a first metal plating layer pattern at the bottom surface of the supporting plate 210. A catalyst applying process, an electroless plating process, and a pattern forming process are sequentially performed.

The catalyst applying process is a process for applying a catalyst on the surface of the supporting plate 210 and is performed after a cleaning process on the surface of the supporting plate 210 is completed. The catalyst is a metal material and is applied on an entire bottom area of the supporting plate 210. Plating is performed only in an area where a catalyst is applied.

After the catalyst is applied, a first metal plating layer is applied. The first metal plating layer is formed through an electroless plating method. The electroless plating method is a process of precipitating metal on a surface of an object to be processed by reducing metal ions in a metallic salt solution by using the strength of a reducing agent through a self-catalytic method, instead of receiving electrical energy from the outside. Since metal is slowly precipitated on the surface of the object to be processed in the electroless plating process, the first metal plating layer may be applied at a thin thickness. The first metal plating layer is applied to an area where the catalyst is applied, i.e., an entire bottom area of the supporting plate 210.

Figure 8:
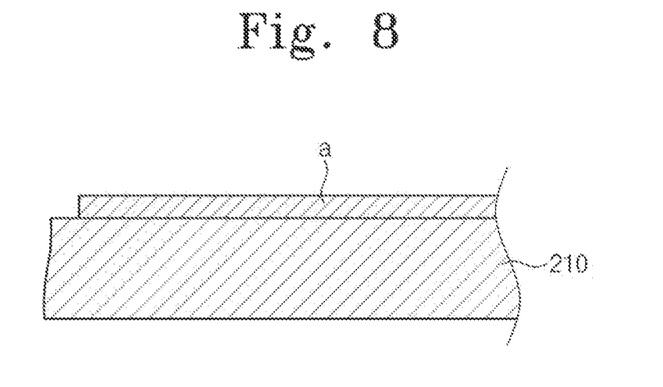
FIGS. 8 to 12 are views illustrating a process of manufacturing a supporting unit according to the flowchart of FIG. 7.

The pattern forming process removes areas other than areas corresponding to a pattern in an area of the first metal plating layer. The pattern forming process may be accomplished through a photolithography process and its detailed description is omitted. Once the pattern forming process is completed, as shown in FIG. 8, a first metal plating layer pattern a is formed at the bottom surface of the supporting plate 210.

Figure 9:
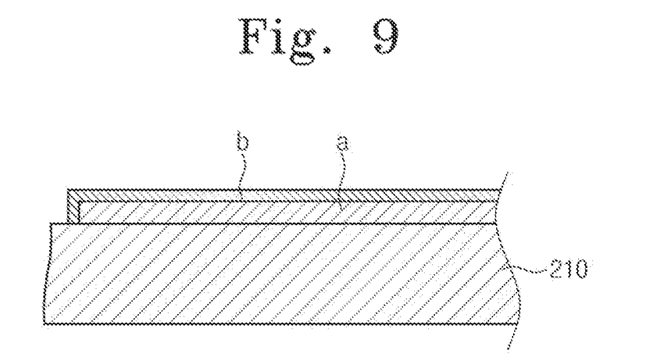

The forming of the anti-oxidation layer pattern in operation S200 form an anti-oxidation layer b on the first metal plating layer pattern a. The forming of the anti-oxidation layer pattern in operation S200 is performed through an electroless plating method. Since the first metal plating layer pattern a serves as a catalyst, the anti-oxidation layer b is applied on only the surface of the first metal plating layer pattern a. As shown in FIG. 9, the anti-oxidation layer b is applied on an entire area of the first metal plating layer pattern a, by using the same pattern as the first metal plating layer pattern a. The anti-oxidation layer b is very thinly applied on the first metal plating layer pattern a so as to prevent the first metal plating layer pattern a from being exposed to air.

The forming of the second metal plating layer in operation S300 is a process of forming a second metal plating layer c in the area of the anti-oxidation layer pattern b corresponding to a non-heating area and including a mask applying process, an electrolytic plating process, and a mask removing process.

Figure 10:
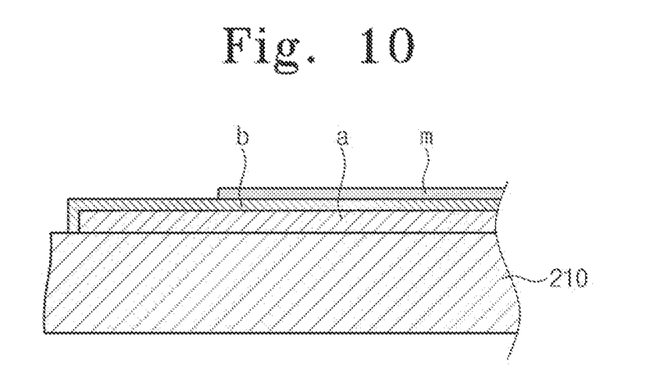

The mask applying process, as shown in FIG. 10, applies a mask m in the area of the anti-oxidation layer b where no second metal plating layer c is required. The mask m prevents the second metal plating layer c from being formed on the anti-oxidation layer b. The mask m may be provided in a tape form and may be detachable.

Figure 11:
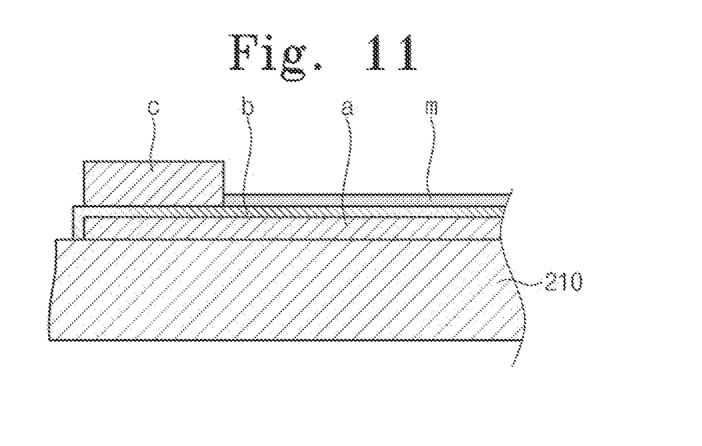

Once the mask m is applied, a second metal plating layer c is formed through an electrolytic plating method. The electrolytic plating method is a process of applying a layer of another metal on a metal surface through the principle of electrolysis, and may apply a metal layer at a faster speed, compared to an electroless plating method. The second metal plating layer c is not applied in an area where the mask m is applied, as shown in FIG. 11, and is applied on the anti-oxidation layer b in an area where no mask m is applied. The second metal plating layer c is applied at a thicker thickness than the anti-oxidation layer b. Since the second metal plating layer c is applied through an electrolytic plating method, a time for application may be short.

Figure 12:
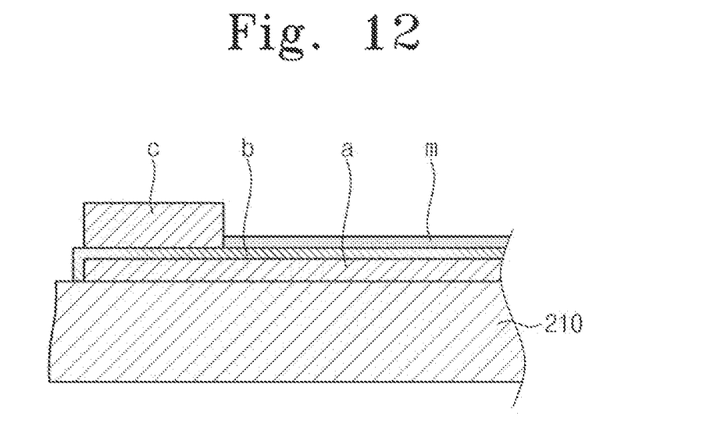

Once the second metal plating layer c is completely applied, the mask m is removed as shown in FIG. 12.

Figure 13:
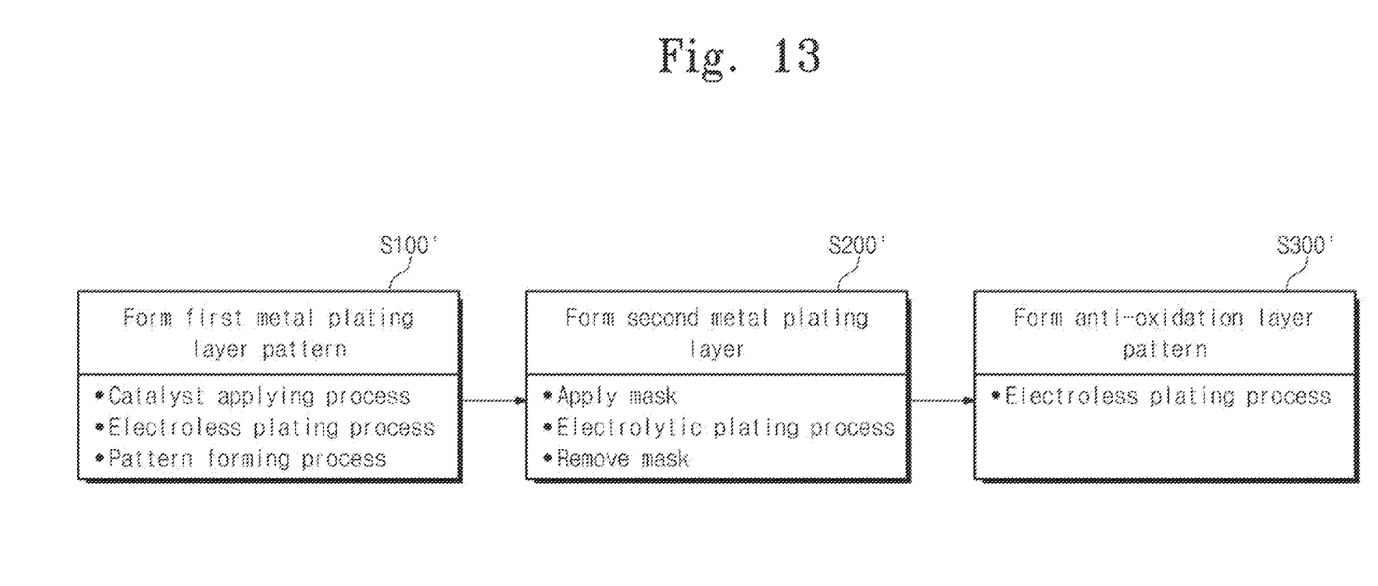
FIG. 13 is a flowchart illustrating a process of manufacturing a supporting unit according to an embodiment of the present invention.

FIG. 13 is a flowchart illustrating a process of manufacturing a supporting unit according to an embodiment of the present invention. FIGS. 14 to 18 are views illustrating a process of manufacturing a supporting unit according to the flowchart of FIG. 13.

Referring to FIGS. 13 to 18, the method of manufacturing a supporting unit includes forming a first metal plating layer pattern in operation S100', forming a second metal plating layer in operation S200', and forming an anti-oxidation layer patter in operation S300'.

Figure 14:
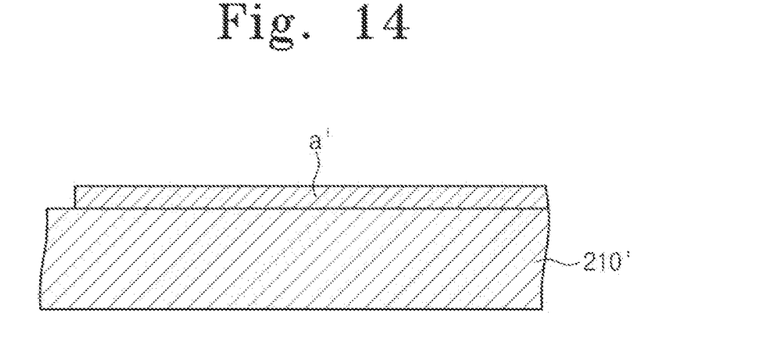
FIGS. 14 to 18 are views illustrating a process of manufacturing a supporting unit according to the flowchart of FIG. 13.

The forming of the first metal plating layer pattern in operation S100' forms a first metal plating layer pattern a' on the bottom surface of the supporting plate 210 as shown in FIG. 14. Since the forming of the first metal plating layer pattern in operation S100' is identical to the forming of the first metal plating layer pattern in operation S100, its detailed description is omitted.

The forming of the second metal plating layer in operation S200' is a process of forming a second metal plating layer b' on the pattern area of the first metal plating layer pattern a' corresponding to a non-heating area and including a mask applying process, an electrolytic plating process, and a mask removing process.

Figure 15:
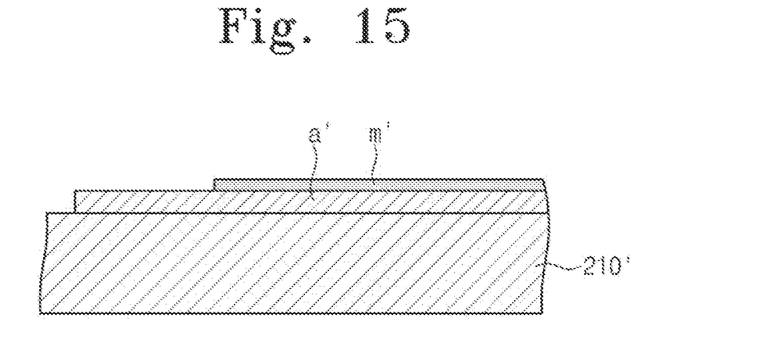

The mask applying process, as shown in FIG. 15, applies a mask m in the area of the first metal plating layer pattern a' where no second metal plating layer b' is required. The mask m' prevents the second metal plating layer b' from being formed on the first metal plating layer pattern a'. The mask m' may be provided in a tape form and may be detachable.

Figure 16:
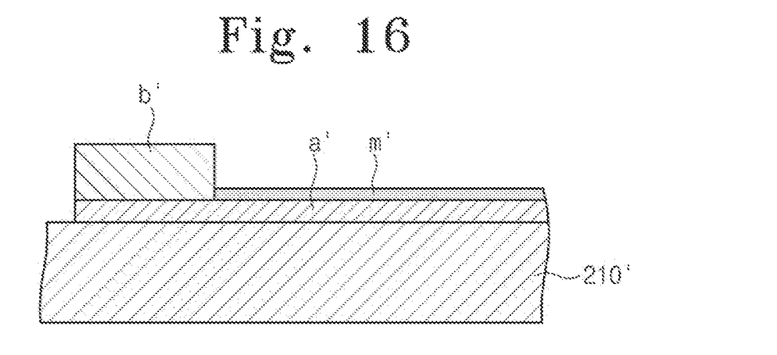
Figure 17:
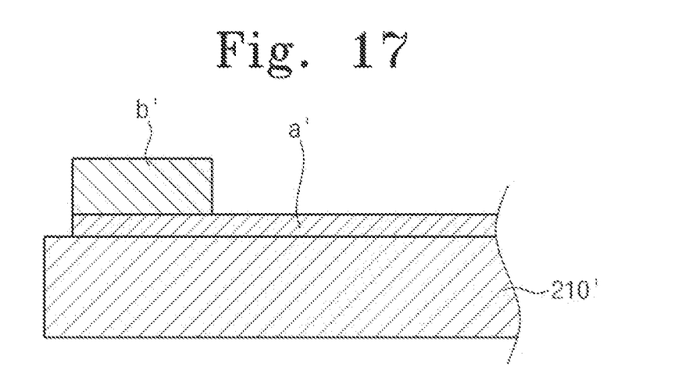

Once the mask m' is applied, a second metal plating layer b' is formed through an electrolytic plating method. The second metal plating layer b' is not applied in an area where the mask m' is applied, as shown in FIG. 16, and is applied on the first metal plating layer pattern a' in an area where no mask m' is applied. The second metal plating layer b' is applied at a predetermined thickness Once the second metal plating layer b' is completely applied, the mask m is removed as shown in FIG. 17.

Figure 18:
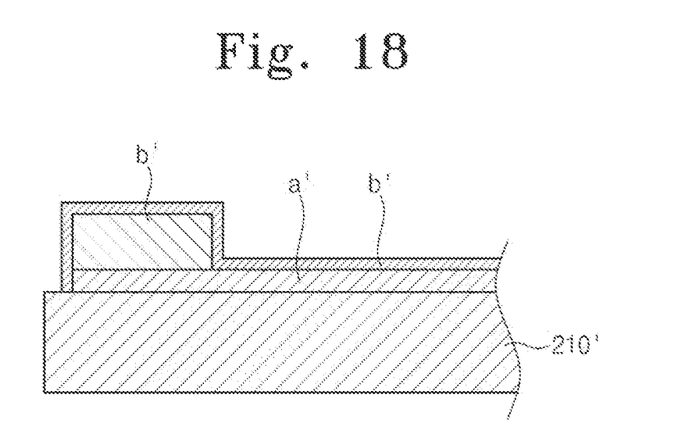

The forming of the anti-oxidation layer patter in operation S300' forms an anti-oxidation layer pattern c' on the first metal plating layer pattern a' and the second metal plating layer b'. The forming of the anti-oxidation layer pattern in operation S300' is performed through an electroless plating method. Since the first metal plating layer pattern a' and the second metal plating layer b' serve as a catalyst, the anti-prevention layer c', as shown in FIG. 18, is separately applied on the surface of the first metal plating layer pattern a' and the surface of the second metal plating layer b'. The anti-oxidation layer c' is applied at a very thin thickness and prevents the first metal plating layer pattern a' and the second metal plating layer b' from being exposed to air.

The supporting unit may be provided during a bake process. Additionally, the supporting unit may be applied to various processes for heating a substrate at a predetermined temperature and processing it.

Furthermore, a substrate provided to a treatment process may include a wafer for semiconductor production and a substrate for flat display panel production.

According to embodiments of the present invention, since heat is generated in a desired area of a heater pattern, each area of a substrate is heated uniformly.

According to embodiments of the present invention, a thickness of a metal layer used for forming a hater pattern is adjusted by each area through a method of manufacturing a supporting unit.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A supporting unit for heating a semiconductor substrate, comprising:
   a supporting plate configured to support the semiconductor substrate on a top surface thereof; and
   a heater having a predetermined pattern at a bottom surface of the supporting plate and heating the supporting plate,
   wherein the heater comprises:
      a first metal plating layer applied on the bottom surface of the supporting plate along the predetermined pattern;
      an anti-oxidation layer of a conductive material applied on the first metal plating layer along the predetermined pattern; and
      a second metal plating layer of a conductive material applied on the anti-oxidation layer in a portion of the predetermined pattern, and
   wherein the second metal plating layer is thicker than the first metal plating layer.

2. The supporting unit of claim 1, wherein the second metal plating layer has a thicker thickness than the anti-oxidation layer.

3. The supporting unit of claim 1, wherein the anti-oxidation layer and the second metal plating layer are formed of the same material.

4. The supporting unit of claim 2, wherein the predetermined pattern includes a terminal part that is directly connected to a wire connected to an external power, and the first metal plating layer, the anti-oxidation layer, and the second metal plating layer are sequentially applied on the terminal part.

5. The supporting unit of claim 2, wherein the heater comprises:
   a first pattern formed in a first area of the supporting plate;
   a second pattern formed in a second area of the supporting plate separated from the first area, and separated from the first pattern; and
   a connection pattern connecting the first pattern and the second pattern,
   wherein the first metal plating layer and the anti-oxidation layer are sequentially applied on the bottom surface of the supporting plate in the first pattern and the second pattern, and
   wherein the first metal plating layer, the anti-oxidation layer, and the second metal plating layer are sequentially applied on the bottom surface of the supporting plate in the connection pattern.

6. The supporting unit of claim 3, wherein the second metal plating layer is formed of gold (Au).

7. A substrate processing device comprising:
   a chamber having a space therein;
   a supporting plate provided inside the chamber and including a semiconductor substrate on a top surface thereof; and
   a heater forming a predetermined pattern at a bottom surface of the supporting plate and heating the supporting plate,
   wherein the heater has a first portion of the predetermined pattern for generating heat based on current applied to the predetermined pattern and a second portion of the predetermined pattern for generating no heat, and
   wherein the second portion is located near a terminal of the predetermined pattern,
   wherein a first metal plating layer and an anti-oxidation layer are sequentially applied on the bottom surface of the supporting plate in the first portion of the predetermined pattern,
   wherein the first metal plating layer, the anti-oxidation layer, and a second metal plating layer are sequentially applied on the bottom surface of the supporting plate in the second portion of the predetermined pattern, and
   wherein the second metal plating layer is thicker than the anti-oxidation layer of a metal material.

8. The substrate processing device of claim 7, wherein the anti-oxidation layer and the second metal plating layer are formed of the same material.

9. The substrate processing device of claim 7, wherein the heater includes a terminal part that is directly connected to a wire applying current, and the terminal part corresponds to the second portion of the predetermined pattern.

10. The substrate processing device of claim 7, wherein the bottom surface of the supporting plate has a first area and a second area separated from each other,
    wherein the heater comprises:
       a first pattern formed in the first area and corresponding to the first portion of the predetermined pattern;
       a second pattern formed in the second area and corresponding to the first portion of the predetermined pattern; and
       a connection pattern connecting the first pattern and the second pattern and corresponding to the second portion of the predetermined pattern.

* * * * *